United States Patent [19]

Minarik

[11] Patent Number: 4,736,171
[45] Date of Patent: Apr. 5, 1988

[54] ADAPTIVE MICROWAVE CHANNELIZATION

[75] Inventor: Ronald W. Minarik, Lutherville, Md.

[73] Assignee: The United States of America as represented by the Secretary of the Air Force, Washington, D.C.

[21] Appl. No.: 819,073

[22] Filed: Jan. 15, 1986

[51] Int. Cl.$^4$ ............................................. H03H 5/00
[52] U.S. Cl. .................. 333/24 R; 333/132; 333/101; 455/150; 455/154
[58] Field of Search ............... 333/132, 134, 135, 126, 333/129, 101, 103; 370/69.1, 123; 455/150, 154

[56] References Cited

U.S. PATENT DOCUMENTS

| | | | |
|---|---|---|---|
| 3,922,676 | 11/1975 | O'Berry et al. | 343/17.1 PF |
| 3,965,428 | 6/1976 | Katz et al. | 325/474 |
| 4,158,842 | 6/1979 | Clemens et al. | 343/7 PF |
| 4,159,454 | 6/1979 | Willmore | 333/202 |
| 4,194,205 | 3/1980 | Willmore et al. | 343/17.7 |
| 4,338,528 | 7/1982 | Wolkstein | 307/511 |
| 4,393,382 | 7/1983 | Jones | 343/112 D |

*Primary Examiner*—Eugene R. LaRoche
*Assistant Examiner*—Seung Ham
*Attorney, Agent, or Firm*—William G. Auton; Donald J. Singer

[57] ABSTRACT

A signal processing system is disclosed that divides a broad band of input signals into separate channels separated by stopbands and permits operation in the crossover frequencies occuring at these stopbands. A triplexer separator receives and divides the broad band of input signals into a first, second and third band of signals, and sends them respectively to a first, second and third signal channel. The first and third signal channels are narrow bands which respectively occur at the lower and upper frequency end of the broad band of input signals. The second signal channel is identical to the broad band of input signals. In normal operation the first, second and third signal channels separately and independently conduct their respective signals to a triplexer combiner, where they are recombined. However, if signal processing is planned at crossover frequencies in the stopbands of either the first or third signal channel, the first or third band of signals can be directed into the second signal channel to permit such operation.

7 Claims, 2 Drawing Sheets

ADAPTIVE MICROWAVE CHANNELIZATION

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to microwave signal processing systems, and specifically to an apparatus that permits both: independent channelized signal processing, and also operation at carrier frequencies that lie within the stopbands which separate the signal channels.

Channelized microwave assemblies commonly divide a comparatively broad microwave band into a plurality of smaller bands which are conducted on separate channels to a destination, then recombined into the original broad microwave band. Because the signal processing in each channel must be independent, i.e., have minimal effect upon the signal in adjacent channels, the multiplexers usually possess stopbands or "holes" near the crossover frequencies in order to maintain sufficient channel isolation.

The mechanization described above works well for most applications. However, there are specific instances where it is desirable to employ signal processing at the stopbands or holes in the frequency spectrum. Unfortunately signal processing at the stopbands is prevented by the conventional systems, since phase tracking is not maintained between channels separated by the stopbands.

In view of the foregoing discussion, it is apparent that there currently exists the need for a signal processing system which permits operation in the stopbands separating independent signal channels. The present invention is intended to satisfy that need.

SUMMARY OF THE INVENTION

The present invention is a microwave signal processing system which permits operation in three independent microwave signal processing paths, as well as operation in the stopbands which separate the channels. In one embodiment, microwave signals are processed at crossover frequencies using: a triplexer separator, three SP2T switches, three independent radio frequency (RF) signal processing elements, two summing elements, and a triplexer combiner.

The triplexer separator divides a broad microwave band (2–8 GH$_z$) into a first, second, and third channels. These three separate channels respectively conduct 2–4 GH$_z$, 2–8 GH$_z$, and 6–8 GH$_z$ with their independent RF signal processing elements to the triplexer combiner where the broad microwave band is recombined and output in a normal operation.

The three switches each have a single input port and two output ports. When the first and third switches are in the "1" position, they respectively conduct signals from the separator to the signal processing elements of the first and third channels. When operation is required in the crossover frequencies in either the first or third channel, the first or third switch may be positioned in the "2" position so that it conducts the signals into the first summing element which conducts it into the second channel, (also known as the middle channel or broad channel).

Anytime the first or third switch routes signals into the middle channel, the second switch is also placed in the "2" position to interrupt the middle channel so that instead of inputting signals into the triplexer combiner, the second switch inputs signals into the second summing element. This second summing element produces an output signal by combining signals it receives from the triplexer combiner with those from the second switch.

The above results in an electronics circuit which permits operation in three independent microwave signal processing paths. This circuit also permits operation in the stopbands separating the channels.

It is an object of the present invention to provide channelized signal processing and operation at carrier frequencies which lie in the stopbands which separate independent channels.

It is another object of the present invention to provide a channelized mechanization that reduces system delay time.

It is another object of the present invention to provide a channelized mechanization with reduced multiplexer selectivity requirements.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention is an electronics circuit which permits operation in separate signal processing paths as well as operation in the stopbands separating the channels.

Figure 1:
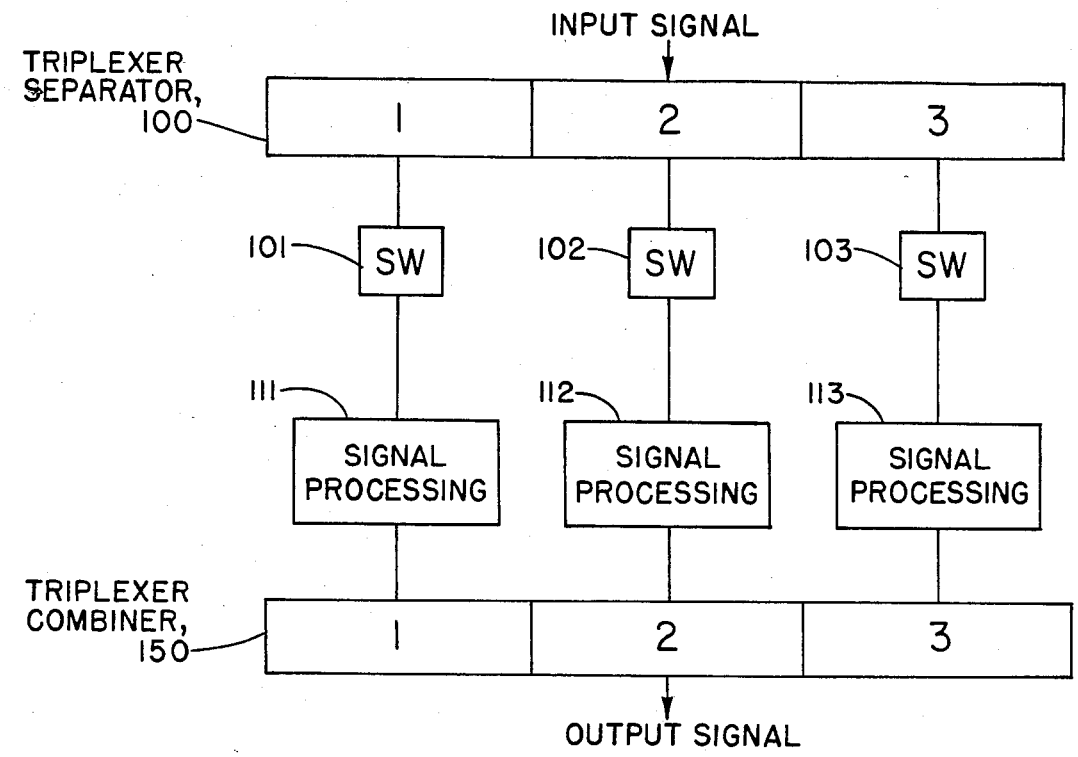
FIG. 1 is a schematic depicting a prior art channelized microwave assembly.

The reader's attention is now directed to FIG. 1, which is a schematic of a prior art channelized microwave assembly. The input separator multiplexer 100 divides a microwave band (e.g., 2–8 GH$_z$) into three channels (e.g., 2–4, 4–6, 6–8 GH$_z$) each channel with identical but independent signal processing elements (111–113).

Each channel also contains a switch (101–103) to turn the channel on or off. A multiplexer combiner 150 then sums the three channels back into the original full band (2–8 GH$_z$ in this case).

Figure 2:
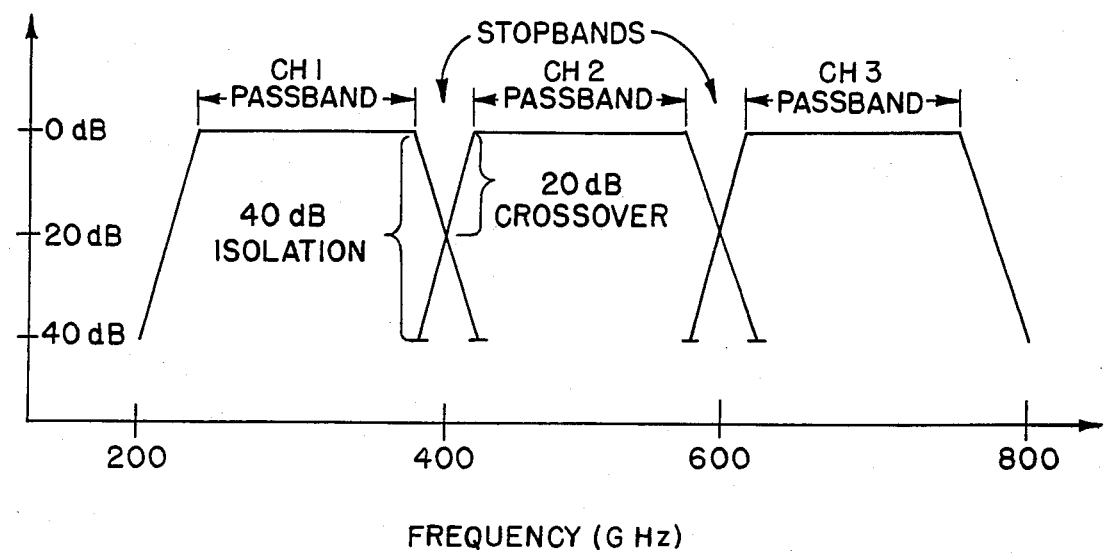
FIG. 2 is a chart illustrating the channel band pass characteristics of the microwave assembly of FIG. 1.
Figure 3:
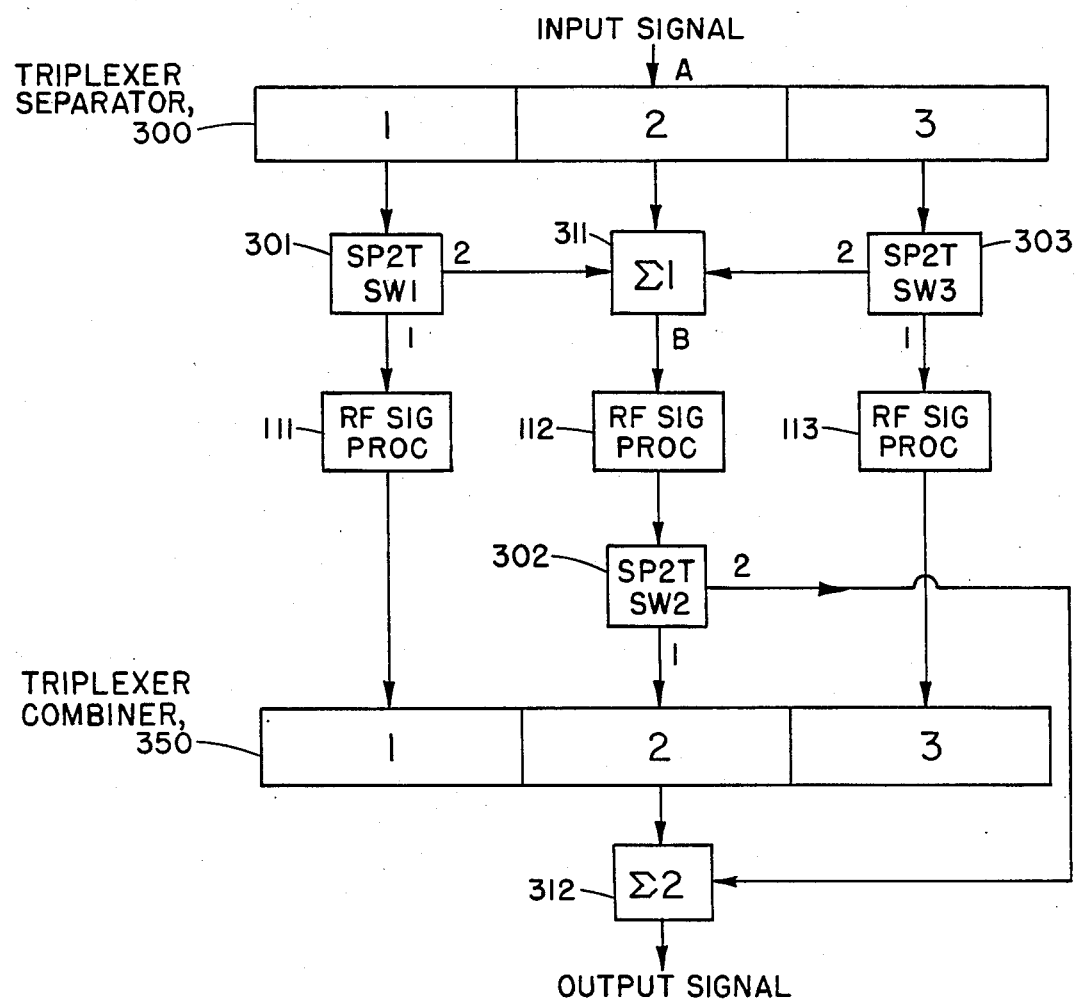
FIG. 3 is a schematic depicting an embodiment of the present invention.

Because the signal processing in each channel must be independent, i.e., have minimal effect upon the signal in adjacent channels, the multiplexers usually possess stopbands or "holes" near the crossover frequencies (4 and 6 GH$_z$) in order to maintain sufficient channel isolation. A typical combined response across the entire band might appear as shown in FIG. 2 where each channel bandpass and adjacent channel isolation is marked as indicated. FIG. 3 is a schematic of the channelized microwave assembly of the present invention. The system of FIG. 3 is designed to perform all the functions of the system of FIG. 1, and, in addition, perform signal processing in the stopbands which separate the channels. Such signal processing capabilities are possible using: a triplexer separator 300, three switches 301-303, three signal processing elements 111-113, and a triplexer combiner 350.

Figure 4:
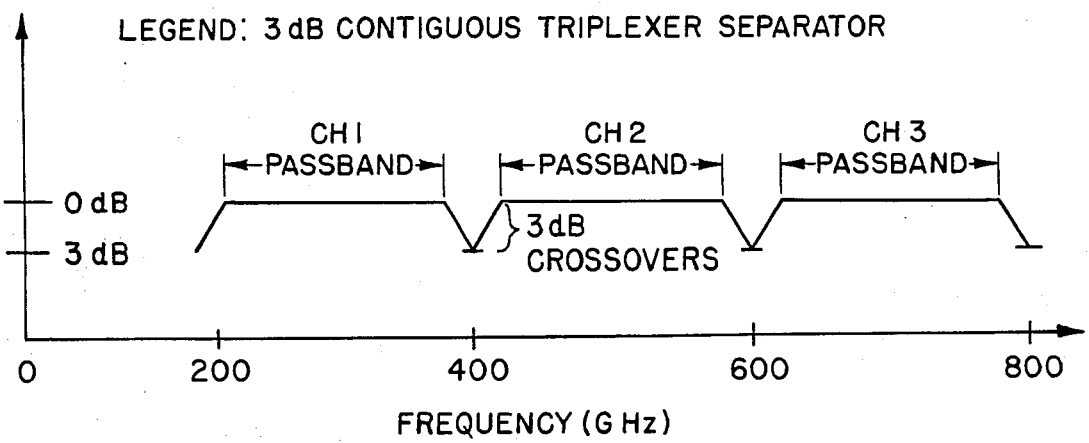
FIG. 4 depicts the signal processing characteristics of a 3dB contiguous triplexer separator which can be modified for use in the embodiment of FIG. 3.

The triplexer separator 300 of FIG. 3 receives and divides a broad microwave band (2-8 GH$_z$) into three separate channels. However, unlike the separator 100 of FIG. 1, the middle channel functions output by the triplexer separator 300 of FIG. 3 is required to operate over the entire (2-8 GH$_z$) band. In other words, the first, second and third channels respectively conduce 2-4 GH$_z$, 2-8 GH$_z$, and 6-8 GH$_z$. The triplexer separator 300 is a standard 3dB contiguous design with the operating characteristics depicted in FIG. 4. Note, however, that the second channel in the present invention includes the entire (2-8 GH$_z$) input band to permit any crossover in the signals operating in the frequencies in the stopbands of signals of the first and third channels. Therefore, the channel 1 and 3 passbands may be as illustrated in FIG. 4, but the separator conducts the entire input band into channel 2 of FIG. 3.

The signal processing system of FIG. 3 may be described as having a separator and combiner 350 which supports first second and third signal channels. The first signal channel contains the first switch 301 and first signal processing element 111. This channel receives and conducts the 2-4 GH$_z$ band microwave signals from the separator 300 to the combiner 350 in normal operation.

The third signal channel contains the third switch 303 and third signal processing element 113. This channel conducts the 6-8GH$_z$ band microwave signals from the separator 300 to the combiner 350 during normal operation.

The second signal channel is known as the middle path, and contains: the first summing unit 311, the second signal processing element 112, and second switch 302. The middle path conducts the entire broad microwave band (2-8 GH$_z$) from the separator 300 to the combiner during normal operation. The middle path also is capable of receiving the smaller signal bands from the first and third signal channels to permit operation in the crossover frequencies in the stopbands that separate the channels. When required, the signal bands from either the first or third signal channels is received by the middle path from the first or third switch 301 or 303.

All switches 301-303 are SP2T switches, with one input port and two output ports. When the first and third switches 301 and 303 are in the "1" position, they conduct their signals into their respective first and third signal channels. However, the first and third switches 301 and 303 can be switched into the "2" position so that they conduct all signals they receive from the separator 300 into the middle path via the first summing element 311. When either the first or third switch 301 or 303 are placed in the "2" position, the second switch 302 should also be placed in the "2" position so that it conducts signals from the middle path into the second summing element 312 instead of the combiner 350.

The electronics circuit described above permits operation in both the three independent microwave signal paths and operation in the stopbands separating the channels. The broad carrier of the middle path permits maintainance of phase tracking of adjacent channels over the relatively narrow bandwidth near the crossover frequencies. The signal path through either switch 302 or 303 and the first summer 311 must track the phase to within plus or minus 90 degrees or less in order to provide only 1 or 2 dB of ripple. This condition is easy to meet because the phase tracking need only be accomplished at the crossover frequency between channels 1 and 2, and because the phase tracking need only be accomplished through several microwave elements.

The mechanization of FIG. 3 adds approximately 9 dB additional loss over the mechanization shown in FIG. 1 and could be offset with additional gain before and after the channelization if necessary. The system of FIG. 3 also permits the use of triplexers which have wider stopbands, since any stopband can be eliminated on a selected basis.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A signal processing system which receives, conducts and divides input signals into three separate channels in which are separated by stopbands, said signal processing system permitting operation in crossover frequencies occurring in said stopbands, said signal processing system comprising:

a triplexer separator which receives and divides said input signals into a first, second, and third band of signals;

first, second, and third signal channels, and first signal channel receiving and conducting said first band of signals from said triplexer separator, said first band of signals being a narrow band at lower frequency end of said input signals;

said third signal channel receiving and conducting said third band of signals from said triplexer separator, said third band of signals being a narrow band at an upper frequency end of said input signals;

said second signal channel receiving and conducting said second band of signals from said triplexer separator, said second signal channel being able to receive said first and third band of signals from said first and third signal channels when there exists operation in stopbands of said first and third band of signals, said second signal channel thereby allowing operation in crossover frequencies of the stopbands of the first and third band of signals;

a triplexer combiner which produces an output signal by receiving and combining said first, second and third band of signals from said first, second and third signal channels when said first, second and third signal channels are not operating in crossover frequencies occuring in said stopbands; and an output summing unit which outputs said input signals from said signal processing system by combining the output signal of the triplexer combiner with all signals received from the second signal channel, said output summing unit receiving signals directly from the second signal channel only when at least of said first and third signal channels is operating at the crossover frequencies in stopbands.

2. A signal processing system, as defined in claim 1 wherein said first signal channel comprises:

a first signal processing element which conducts any of said first band of signals it receives into said triplexer combiner; and a first switch which switches to a first and second setting and has an input port and a first and second output port, said input port of said first switch connected to and receiving said first band of signals from said triplexer separator, said first output port of said first switch conducting said first band of signals into said first signal processing element when said first switch is switched in said first setting, said second output port of said first switch conducting said first band of signals into said second signal channel when said first switch is placed at said second setting, said first switch being placed in said second setting when there exists operation in the stopband of the first band of signals.

3. A signal processing system, as defined in claim 2 wherein said third signal channel comprises:

a second signal processing element which conducts any of said third band of signals it receives into said triplexer combiner; and a second switch which switches to a first and second setting and has an input port and a first and second output port, said input port of said second switch receiving said first band of signals from said triplexer separator, said first output port of said first switch conducting said third band of signals into said second signal processing element when said second switch is at the first setting, said second output port of said second switch conducting said third band of signals into said second signal channel when said second switch is placed at said second setting, said second switch being placed at said second setting when there exists operation in the stopband of the third band of signals.

4. A signal processing system, as defined in claim 3, wherein said second signal channel comprises:

an input summing unit which has a first, second and third input port and an output port, said summing unit producing an output signal on its output port by combining all signals it receives on its input ports, said first input port being connected to and receiving signals from the second output port of the first switch when the first switch is in its second setting, said second input port being connected to and receiving said second band of signals from said triplexer separator, said third input port being connected to and receiving signals from said second output port of said second switch when said second switch is in its second setting;

a third signal processing element which receives and conducts signals from the output port of the input summing unit; and a third switch which switches to a first and second setting and has an input port and a first and second output port, said input port of said third switch receiving signals from said third signal processing element, said first output port of said third switch conducting signals into said triplexer combiner when said third switch is at its first setting, said second output port of said third switch conducting signals into said output summing unit when said third switch is at its second setting.

5. A signal processing system, as defined in claim 4, wherein said broad band of input signals comprises a band of microwave signals of between 2 and 8 $GH_z$, and said first, second and third signal processing elements include waveguides which conduct microwave signals.

6. A signal processing system, as defined in claim 5, wherein said first band of signals comprises a narrow microwave band of between 2 and 4 $GH_z$.

7. A signal processing system, as defined in claim 6, wherein said third band of signals comprises a narrow microwave band of between 6 and 8 $GH_z$.

* * * * *